United States Patent [19]

Norsworthy et al.

[11] Patent Number: 5,512,898
[45] Date of Patent: Apr. 30, 1996

[54] DATA CONVERTER

[75] Inventors: Steven R. Norsworthy, Emmaus, Pa.;
David G. Shaw, Middletown, N.J.

[73] Assignee: AT&T Corp., Murray Hill, N.J.

[21] Appl. No.: 485,303

[22] Filed: Jun. 7, 1995

Related U.S. Application Data

[62] Division of Ser. No. 56,234, Apr. 30, 1993.
[51] Int. Cl.$^6$ .................................................. H03M 1/00
[52] U.S. Cl. ................................................ 341/155; 375/222
[58] Field of Search ..................................... 341/143, 155, 341/144, 110; 375/8

[56] References Cited

U.S. PATENT DOCUMENTS

4,691,233  9/1987  Acampora ............................ 358/136

Primary Examiner—Brian K. Young
Attorney, Agent, or Firm—David L. Smith

[57] ABSTRACT

In accordance with an embodiment of the invention, a data converter is disclosed employing at least one minimum phase FIR filter. The data converter includes an analog-to-digital converter for converting an incoming analog signal into a plurality of digital signal samples, followed by a minimum phase FIR filter to filter the digital signal samples. Alternatively, the data converter includes a digital-to-analog converter preceded by a minimum phase FIR filter to filter a plurality of digital signal samples that are converted into an analog signal by the digital-to-analog converter. The data converter may include both analog-to-digital and digital-to-analog conversion. In a preferred embodiment, the minimum phase FIR filter is an optimum minimum phase FIR filter. A method for precisely calculating the filter coefficients of an optimum minimum phase FIR filter is also disclosed.

32 Claims, 2 Drawing Sheets

DATA CONVERTER

This is a division of application Ser. No. 08/056234 filed Apr. 30, 1993.

TECHNICAL FIELD

This invention relates generally to echo canceling and particularly to minimum phase finite impulse response (FIR) filters for attenuating the echo signal in communications circuits and a method for calculating tap weights of a minimum phase FIR filter.

BACKGROUND OF THE INVENTION

The phenomena of signal echo occurs when a signal passes through an interface from a first transmission medium to a second transmission medium. An impedance mismatch across the interface will cause a portion of the energy of the signal to be reflected back toward the source of the signal as an echo signal. The remaining portion of the energy of the signal propagates along the second medium.

In communication applications, it is desirable to eliminate the echo signal, for example, to improve the quality of audio signals or prevent the occurrence of errors in data transmission. Basic echo cancellation techniques are explained in: the *Bell System Technical Journal,* Vol. 59, No. 2, February 1980, pp. 149–159. One echo elimination technique discussed in the above journal is to detect when a signal is being transmitted in one direction and to attenuate all signals passing in the other direction. Errors in detecting the presence or absence of a signal can cause signal clipping when this echo elimination technique is used. Another technique utilizes subtractive attenuation. To eliminate the echo, the echo is replicated, such as being synthesized by an adaptive filter, then subtracted from the signal. Subtractive attenuation is more signal transparent and reduces signal clipping effects.

Another form of subtractive attenuation is achieved with an echo canceler having fixed coefficients designed to approximate the impulse response of the echo path. Since the impulse response of the echo path is not known, this technique results in imperfect echo canceling. More precise echo canceling is achieved when the echo canceler is adaptive. In an adaptive echo canceler, the tap weights of the echo canceler filter are changed over time to replicate the impulse response of the unknown echo path.

If a FIR filter structure is employed in an echo path, the filter would ideally require an infinite number of tap weights since the unknown echo path generally has an impulse response of infinite duration. An adaptive infinite impulse response filter having only a few tap weights could be used to achieve the necessary echo cancellation. Adaptive infinite impulse response filters, however, may become unstable. As a compromise, an adaptive FIR filter, having a finite number of tap weights, has been employed in echo cancellation applications. Adaptive FIR filters do not perfectly cancel the echo signal.

An adaptive echo canceler adapts to the impulse response of the echo path. When some of the elements of the echo path are known, the known elements can be individually optimized to shorten their impulse response length, that is, to reduce the number of tap weights. The reduced number of tap weights of individual elements contribute to shorten the length of the echo canceler. A reduced number of tap weights in a digital filter results in a reduced number of multiply and add functions to carry out the filtering. Some of the elements in the echo path are digital filters. Digital filters introduce a group delay distortion and a total delay. To optimize a filter, and thereby minimize its length, both the group delay distortion and the total delay must be minimized.

A constant group delay distortion can be achieved only by a linear phase filter. Small variations in group delay distortion can be compensated for in an adaptive equalizer. The group delay through a filter must be as small as possible in the pass band of the filter. Minimizing the group delay cannot be achieved in a linear phase filter. Since the impulse response of the echo path is generally infinite in duration, to perfectly cancel an echo signal requires an echo canceler that has an infinite impulse response. A minimum phase FIR filter provides both the shortest filter length and the minimum group delay distortion in a single filter. A minimum phase FIR filter also has all of its zeros on or inside the unit circle in the complex z-plane. Equivalently, a minimum phase FIR filter has no zeros outside the unit circle in the complex z-plane.

To employ a minimum phase FIR filter in an echo path would provide enhanced echo cancellation in that the length of the echo canceler would be shorter than for prior art methods. A further improvement in echo cancellation can be achieved by employing in an echo path a filter designed in accordance with the minimum phase alternation theorem set forth in Chen and Parks, *"Design of Optimal Minimum Phase FIR Filters,"* Signal Processing, Vol. 10, June 1986, pp. 369–383. A minimum phase FIR filter designed to meet the minimum phase alternation theorem will hereafter be referred to as an optimum minimum phase FIR filter. An optimum minimum phase FIR filter has the shortest filter length and minimum group delay for a given set of magnitude constraints on the ideal frequency response. Group delay distortion results from nonlinear phase. Although an optimum minimum phase FIR filter does not have perfectly linear phase, small deviations within the passband are permitted and are compensated for in an adaptive equalizer. However, extensive use of minimum phase FIR filters has been prevented by computational difficulties in precisely calculating the filter coefficients. Minimum phase FIR filters were a curiosity, interesting to theoreticians but of little practical application.

There are several reports in the literature of attempts to design minimum phase FIR filters. For example: Hermann and Schussler, "Design Of Non-recursive Digital Filters With Minimum Phase," Electronic Letters, 1970, Vol. 6, pp. 329–330; Kamp and Wellekens, "Optimal Design of Minimum Phase FIR Filters"; Chit and Mason, "Design of minimum phase FIR digital filters", IEE Proceedings, Vol. 135, December 1988, pp. 258–264; and Parks and Burrus, *Digital Filter Design,* John Wiley and Sons, New York, N.Y., 1987. However, the skilled artisan can not presently use these methods to design practical minimum phase FIR filters because of limitations that render the methods unable to accommodate more complex filter designs of practical importance or not consistently reliable.

Hermann and Schussler introduced a method for specifying a minimum phase FIR filter to convert a filter specification into a linear phase filter and subsequently the linear phase filter into a minimum phase FIR filter. The Hermann and Schussler method has at least two major shortcomings. Firstly, it is not sufficiently general; the method can be used to design two-band filters but cannot accommodate filters requiring more than one stop band. Secondly, infinite attenuation cannot be specified at specific frequencies. In other words, the exact location of a zero cannot be specified. Using the Hermann and Schussler method, the skilled artisan can specify only limited attenuation over a frequency band.

Kamp and Wellekens reported a method for optimal design of minimum phase FIR filters. A constrained approximation procedure was used to obtain the magnitude function and the transmission zeros in the stopband(s). The zeros inside the unit circle are calculated via a low-degree polynomial factorization. A straightforward exchange algorithm is presented which achieves the constrained approximation step. This method has the same shortcomings as the Hermann and Schussler method.

Chit and Mason described a method for designing minimum phase FIR digital filters. The filter coefficients are determined through a least means squared (LMS) algorithm such that the realized filter coefficients are produced at the final convergence. The cost functions in the adaptation of the LMS algorithm are minimized. These cost functions are the frequency domain specifications of the desired filter. However, convergence noise in the LMS calculations causes nonoptimal location of filter zeros.

Parks and Burrus disclose a three step procedure, similar to Hermann and Schussler, for designing minimum phase FIR digital filters. The Parks and Burrus method takes advantage of characteristics of the impulse response polynomial to reduce the order of a polynomial ultimately factored. For each zero crossing on the frequency axis, a double pair of complex zeros (four zeros) is located on the unit circle at that frequency. The four zeros form a fourth order polynomial which can be readily factored out of the impulse response polynomial, or a reduced order polynomial from which other double pairs of complex zeros have been factored. Factoring the remaining reduced order polynomial is relatively easier than factoring the impulse response polynomial. The order of the remaining polynomial to be factored will always be less than the order of the original impulse response. Narrow passband filters have nearly all of their zeros on the unit circle. These zeros could be readily factored out of the impulse response polynomial. Factoring out these zeros significantly reduces the order of the impulse response polynomial.

Conversely, for narrow stopband filters, the impulse response is a very high order polynomial and few zeros are located on the unit circle. The Parks and Burrus method does not provide a significant reduction in the order of the polynomial to be factored. Even when the zeros on the unit circle are factored out, the remaining polynomial is very close in order to the order of the impulse response polynomial, and the difficulty of factoring the very high order polynomial is not overcome.

It would be desirable to employ minimum phase FIR filters or optimum minimum phase FIR filters in an echo path to minimize the impulse response length and the group delay of the filter. A method for precisely calculating filter coefficients for a minimum phase FIR filter that overcomes the problems of the prior art would facilitate using such filters. Employing minimum phase FIR filters, or optimum minimum phase FIR filters, in an echo path contributes to minimizing the length of an echo canceler. The method would be sufficiently general to accommodate multiple stop bands and permit precise location of zeros.

SUMMARY OF THE INVENTION

In accordance with an embodiment of the invention, a data converter is disclosed employing at least one minimum phase FIR filter. The data converter includes an analog-to-digital converter for converting an incoming analog signal into a plurality of digital signal samples, followed by a minimum phase FIR filter to filter the digital signal samples. Alternatively, the data converter includes a digital-to-analog converter preceded by a minimum phase FIR filter to filter a plurality of digital signal samples that are converted into an analog signal by the digital-to-analog converter. The data converter may include both analog-to-digital and digital-to-analog conversion. In a preferred embodiment, the minimum phase FIR filter is an optimum minimum phase FIR filter. A method for precisely calculating the filter coefficients of an optimum minimum phase FIR filter is also disclosed.

DETAILED DESCRIPTION

Figure 1:
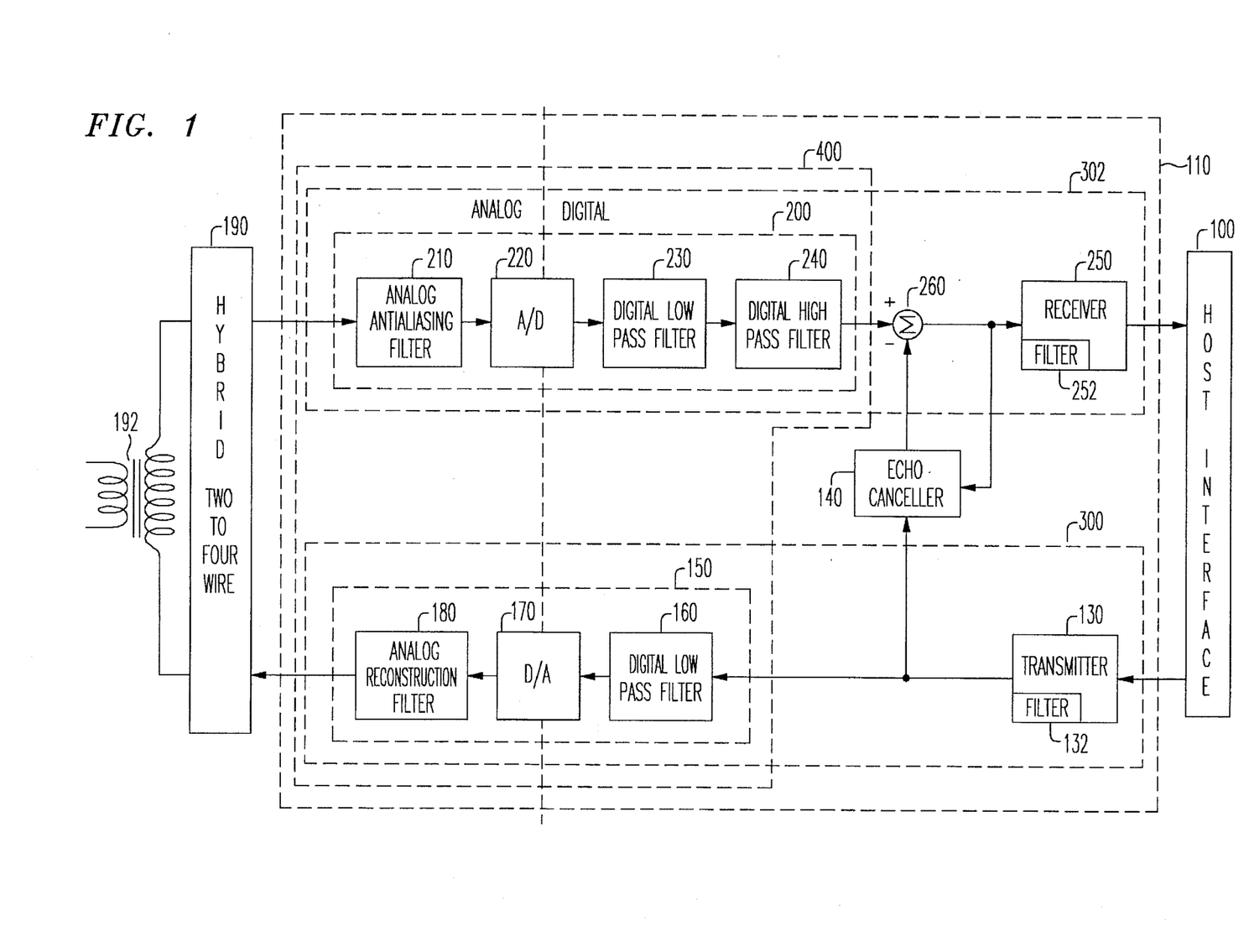
FIG. 1 is a block diagram showing an environment in which an embodiment of the invention may be used.

In FIG. 1, modem 110 is a full duplex data transceiver system. A first digital bit stream, or first data stream, is sent through host interface 100 to transmitter 130 and is filtered by transmitter filter 132 to remove out of band energy from the first data stream. In the transmitter, the first data stream is modulated by an appropriate method, relevant to the modem standard that is employed, such as frequency shift keying, quadrature amplitude modulation, or quadrature phase shift keying, to provide the transmitter output first data stream. Alternatively, the transmit symbols may be encoded by baseband techniques such as 2B1Q and 3B2T. The transmitter output first data stream is the input to digital low pass filter 160 and a first input to echo canceler 140. Filter 160 filters out low frequency noise from the first data stream and provides the filtered first data stream as input to digital-to-analog converter 170. Digital-to-analog converter 170 converts the first data stream to an analog signal. The analog signal is filtered by analog reconstruction filter 180 and then conducted to hybrid 190 and onto a communication network.

A portion of the analog signal output from filter 180 is reflected back toward host interface 100 and received through hybrid 190 along with an analog signal from a remote modem. This combined received analog signal is filtered by analog antialiasing filter 210 and then convened by analog-to-digital converter 220 to a second digital bit stream or second data stream. The second data stream is filtered by digital low pass filter 230 and digital high pass filter 240 to remove the DC and power supply frequencies. The filtered second data stream output from filter 240 is summed with the output of echo canceler 140 in summing junction 260. The output data stream from echo canceler 140, when summed in summing junction 260 with the second data stream output from filter 240, cancels the reflected portion of the transmitted first data stream. The second data stream output from summing junction 260 provides the input to receiver 250 and a second input to echo canceler 140. Receiver 250 demodulates the encoded information in the second data stream to recover the data stream transmitted by a remote modem. Receiver filter 252 removes out of band energy.

In a preferred embodiment, one or more of the transmitter filter 132, digital lowpass filter 160, digital low-pass filter 230, digital highpass filter 240, and receiver filter 252, in any combination, is or are a minimum phase FIR filter. In a further preferred embodiment, all of the filters are minimum phase FIR filters. In yet a further preferred embodiment, one or more of the filters in any combination are optimum minimum phase FIR filters. Generally receiver filter 252 and transmitter filter 132 are not simultaneously minimum phase FIR filters, or simultaneously optimum minimum phase FIR filters.

The invention will be described in greater detail with reference to the block diagram of FIG. 1 in which an embodiment of the invention may be used in a modem connected to a switched network where the analog-to-digital conversion samples at a rate at or above the Nyquist rate. Host interface 100 is coupled to modem 110. More specifically, host interface 100 is coupled to transmitter 130, which includes transmitter filter 132. Transmitter 130 is coupled both to echo canceler 140 and the digital-to-analog section 150 of modem 110. The digital-to-analog section 150 is comprised of series-coupled digital low-pass filter 160, digital-to-analog converter (DAC) 170, and analog reconstruction filter 180. Collectively, transmitter 130 and the digital-to-analog section 150 comprise transmit path 300. Filter 180 is coupled to hybrid 190 which is isolated from the switched network by isolation mechanism 192. A modem (not shown) with which modem 110 is communicating is coupled to a remote end of the network. Also coupled to hybrid 190 to receive data transmitted by the remote end modem is analog-to-digital section 200. The analog-to-digital section is comprised of serially coupled analog antialiasing filter 210, analog-to-digital converter 220, digital low-pass filter 230 and a digital high-pass filter 240. A coder-decoder employing the invention is not limited to modem applications, but may be used in such applications as telephone switching equipment, speech coding systems, and audio systems. A coder-decoder may not include digital high pass filter 240. Additional applications, requiring an echo canceler, in which the invention may be used include but are not limited to public switched network modems, private line two-wire modems, Integrated Services Digital Network (ISDN) 2B+D subscriber loops, High-speed Digital Subscriber Line (HDSL) Asymetric Digital Subscriber Line (ADSL), and Fiber Data Distributed Interfaces(FDDI). Additional applications not necessarily requiring echo cancellation that require digital filtering to provide low group delay, include but are not limited to telephone line cards, speech and audio coding systems and more generally audio systems.

The high-pass filter is coupled both to echo canceler 140 and to a receiver 250. The output of digital high-pass filter 240 is summed with the output of echo canceler 140 by summing junction 260. The output of summing junction 260 is coupled as an input to both echo canceler 140 and receiver 250. Receiver 250 includes filter 252. Receiver 250 is coupled to host interface 100 as an input. Collectively, analog-to-digital section 200 and receiver 250 comprise receive path 302. The digital-to-analog section 150 and the analog-to-digital section 200 form a coder-decoder 400, which is the front end of modem 110.

Host interface 100 might consist of a data terminal, such as an RS232 data terminal, or a modem embedded in a computer mother board application such that the remote end modem interfaces directly with the host's microprocessor bus. The outgoing data from host interface 100 is transmitted by transmitter 130 and is filtered by transmitter filter 132 to remove out-of-band energy from the modulated digital samples. The function of filter 132 may be embedded in filter 160, or the function of filter 160 may be embedded in filter 132. When the function of one of the filters is embedded in the other filter, the combined filter is generally a minimum phase FIR filter; simultaneously filter 252 is not a minimum phase FIR filter. The data from transmitter 130 are modulated into words, such as, by the well-known "quadrature-amplitude phase-shift keying" (QPSK) technique. The transmitter output is in digital form and is input to both echo canceler 140 and the digital-to-analog section 150.

The primary purpose of the digital low-pass filter 160 is to increase the sampling rate such that the sampling rate of the DAC 170 is relatively high. The transmitter 130 operates at a relatively low rate, such as the Nyquist rate of the highest frequency of interest. The digital low-pass filter 160 is an interpolation filter that increases the sampling rate by a multiple, such as L, from the Nyquist sampling rate to L times the Nyquist sampling rate. Filter 160 is not required when the digital-to-analog section 150 is operating at the Nyquist rate.

Analog reconstruction filter 180 smooths the step-wise continuous analog output of DAC 170 to provide a filtered analog signal to data access arrangement 190 for transmission over the switched network to a far-end modem. Data access arrangement 190 includes an isolation device 192 to provide high voltage isolation. A transformer is shown but the isolation device need not be a transformer. Other isolation devices such as linear opto-couplers would suffice.

Some of the energy transmitted by modem 110 to data access arrangement 190 and the remote modem is reflected back into receiver 250. The remote modem is also simultaneously sending data that is received by modem 110 receiver 250. Some of the energy transmitted by the remote modem is reflected back toward the remote modem as a reflected signal. The remainder of the energy that enters modem 110 while transmitter 130 is active should be canceled by echo canceler 140. Ideally, the output of summing junction 260 contains only the signal from the remote end and not energy from transmitter 130 which is reflected through data access arrangement 190. That is, the output of summing junction 260 does not contain a reflected component. The transmitter 130 output that is reflected back into modem 110 is due to a mismatch of impedances, due to both the two-to-four wire conversion and the unknown load impedance of the line, a mismatch of unknown magnitude that necessitates the echo canceler.

The analog antialiasing filter 210 is a digital filter intended to remove noise near the sampling rate frequency of the analog-to-digital converter 220. When the analog-to-digital converter 220 is sampling the received signal at a relatively high rate, typically some multiple of the Nyquist rate, the purpose of the digital low-pass filter 230 is to lower the sampling rate down to the Nyquist rate without introducing noise. The narrow-band antialiasing filter 230 may have several stages to achieve the filtering. Filter 230 is not required when the analog-to-digital section 200 is operating at the Nyquist rate.

Each time a stage of filtering occurs, out of band energy is removed. Upon increasing the sample rate, the out of band energy is removed subsequent to increasing the sample rate. Upon decreasing the sample rate, out of band energy is removed prior to decreasing the sample rate. In this manner, out of band energy is prevented from aliasing into the passband or imaging into the stop band.

The digital high-pass filter 240 removes the DC and AC power supply noise, such as 50 or 60 hertz components, from the incoming signal, which the echo canceler 140 cannot remove.

The echo canceler 140 cancels the type of signal energy sent by transmitter 130 for canceling near-end echo. The high-pass filter removes the DC and AC power supply noise, such as 50 or 60 hertz components, prior to the received signal containing them is passed to the echo canceler.

The echo canceler adapts to the impulse response of the signal path, including high-pass filter 240, to eliminate the echo from the transmitted signal. After the echo canceler has settled, its impulse response would look like the convolution of all of the combined filters in the circuit.

Receiver 250 receives the output of the summing junction 260 and demodulates the signal. Receiver 250 includes a filter 252 to remove out of band energy. The output of receiver 250 is provided to host interface 100.

The effect of digital high-pass filter 240 dominates the performance of modem 110. If there were only one filter that was a minimum phase FIR filter, preferably, it would be the digital high-pass filter 240. When all of the transmitter filter 132, digital low pass filter 160, digital low-pass filter 230, digital high-pass filter 240, and receiver filter 252 being minimum phase FIR filters, a two-decibel performance improvement was achieved.

Minimum phase FIR filters provide the advantage of reduced order or length for a given magnitude specification. A minimum phase FIR filter has minimum length, which means both minimum time for an input signal to pass through a filter in the process of being filtered and minimum number of tap weight coefficients. A minimum phase FIR filter also has the advantage of lower coefficient sensitivity compared with the more common linear phase filters. Optimum minimum phase FIR filters provide the enhanced advantage of the shortest possible length for a given set of constraints. The theoretical coefficients are irrational floating point numbers. Any implementation of the coefficients, if finite in bit length, requires that the coefficients be represented as rational numbers. Implementation is hardware constrained to fixed-point arithmetic of typically 16 or 32 bits. The coefficients can be either positive or negative. Due to lower coefficient sensitivity, filter coefficient quantization can be achieved with less precision for an optimum minimum phase FIR filter than for a minimum phase FIR filter, and the filter can still be effective.

Linear phase FIR filters have passband zeros some of which are on, inside, or outside the unit circle in the complex z-plane. A finite impulse response filter is unconditionally stable regardless of where the zeros are located because a finite impulse response filter has only zeros and no poles. A strict definition of "minimum phase FIR filters" means there are no zeros outside the unit circle in the complex z-plane. A FIR filter that has all of its zeros on the unit circle at z=1 is a special-case filter known as a differentiator. Minimum phase FIR filters typically will have zeros both on and inside the unit circle. A minimum phase FIR filter is a filter in which the passband zeros lie on or inside the unit circle and the stop-band zeros lie on the unit circle.

The following procedure is preferred for each optimum minimum phase FIR filter designed. The desired filter frequency response is the specification to be met. A stop band frequency location and attenuation are specified, as are a transition band and pass band attenuation. These specifications provide the input for a commercially available software package capable of calculating the polynomial coefficients, along with the constraint that no zeros should be outside the unit circle in the complex z-plane. The software should use a more general approach to determining the linear-phase filter than the method of Hermann and Schussler. Using the software package, the coefficients of an impulse response polynomial are generated. The polynomial represents the impulse response of a linear-phase filter meeting the input specifications.

A software package that may be used to generate the coefficients of an impulse response polynomial is Meteor. Meteor is a public-domain software package developed with U.S. Government funding and available through Princeton University, Princeton, N.J. See also IEEE *Transactions on Signal Processing,* August 1992, Vol. 40, No. 8, pp. 1901–1909.

The impulse response polynomial is factored to obtain the roots. The roots are obtained by providing the coefficients of the impulse response polynomial as the input to another commercially available software package with the ability to convolve and deconvolve polynomials with user specified high precision. The polynomial factorization requires very high precision, typically greater than 64-bit double-precision arithmetic, to be numerically accurate. The software achieves the high user-specified precision by extending precision in software rather than relying on the precision of the floating-point processor available to execute the software.

A software package that may be used to convolve and deconvolve polynomials is Mathematica. Mathematica is commercially available through Wolfram Research Corporation, Champagne, Ill. Mathematica enables the user to specify arbitrarily high precision for the root calculations.

When a minimum phase FIR filter is being realized, the impulse response polynomial contains twice as many roots as are needed. The roots are zeros of the transfer function and occur in four possible categories:

(1) zeros which lie on the real axis occur in reciprocal pairs;

(2) complex zeros not on the unit circle in the complex z-plane occur as complex conjugate pairs and their reciprocals;

(3) real stopband zeros occur in doubles located either at z=1 or at z=−1; and (4) complex stopband zeros occur in double conjugate pairs on the unit circle.

The polynomial roots are either real or are complex conjugate pairs. To meet the definition of a minimum phase FIR filter, only zeros on or inside the unit circle of the complex z-plane are retained. The zeros that determine a minimum phase FIR filter are a subset of the zeros of the impulse response polynomial. Half of the roots are in the correct locations to form the minimum phase filter. The other half of the roots form a maximum phase filter.

One of the double sets of zeros on the unit circle is retained. These zeros are the stopband zeros of the minimum phase FIR filter.

The radial distance from the origin of the complex z-plane to a root is $r_k$. The roots within the unit circle, $r_k < 1$, are retained. These roots correspond to the passband zeros of the minimum phase FIR filter. One root of each complex conjugate pair is located at a radius $r_k$ from the origin of the complex z-plane, whereas the other root of the complex conjugate pair is located at $1/r_k$. The roots within the unit circle, $r_k < 1$, are retained for minimum phase filter realization. The redundant roots in the passband at reciprocal locations outside the unit circle, $r_k > 1$, are discarded.

If two roots have a magnitude precisely equal to one, one root is retained and one root is discarded.

After the roots to be retained are selected, a new polynomial, $H_{min}$ (z), expressed as a function of the complex variable z, is constructed. This new polynomial, constructed using the retained roots, is the impulse response of an optimum minimum phase FIR filter. The new polynomial is formed in the following manner by multiplying first order terms together, where the first order terms include the roots:

$$H_{min}(z)=(z-r_1)(z-r_2)(z-r_3)\ldots(z-r_k)\ldots(z-r_N)$$

$$H_{min}(z)=z^N+c_1z^{N-1}+c_2z^{N-3}+\ldots+c_kz^k+\ldots+c_{N-1}z^1+c_N$$

the new polynomial coefficients, $c_1, c_2, c_3 \ldots c_k$, are the tap weights or coefficients of the optimum minimum phase FIR filter. It is understood that complex conjugate pairs may be expressed as second order terms. The filter thus generated is an optimum minimum phase FIR filter having minimum delay and minimum length in accordance with the minimum phase alternation theorem.

While the degree of precision required to factor the original impulse response polynomial is relatively high, the degree of precision required to calculate the new polynomial is even greater. A root is a numerical quantity which may be expressed in any number system. When expressed in the binary number system, a root is expressed in bits. The degree of precision required to calculate the new polynomial is a function of the number of roots retained and the number of bits in the binary representation of each root. When generating the new polynomial by multiplying the retained roots together, it is desired to retain all of the information contained in the retained roots. For N roots, each having a binary representation B bits in length, the precision in bits, P, to retain all of the information in the roots is given by:

$$P=2B+\log_2 N$$

The product of two multiplicands having binary representations of bit length 2B results in a product having a binary representation (2B)+ 1 bits in length. It is clear that each doubling of the number of roots, each having a binary representation B bits in length, results in one additional bit in the final product.

In some applications, it may not be necessary to meet the minimum phase alternation theorem to achieve an acceptable set of tap weights, with the filter near optimum. A nonoptimum filter can deviate from an optimum filter or from the minimum phase alternation theorem and still provide acceptable filter design. Such a filter design will have more taps than a minimum phase FIR filter design. Factors such as the degree of precision of calculations, more or fewer ripples in the passband or stopband of the ideal frequency response, and tolerance specifications of the ideal frequency response result in filter designs having filter coefficients designed in accordance with the disclosed method that provide some deviation from minimum phase FIR filters. It has been found experimentally that small deviations from the design method easily results in filters with two or three times as many coefficients. This indicates that the coefficient calculation method is sensitive.

Figure 2:
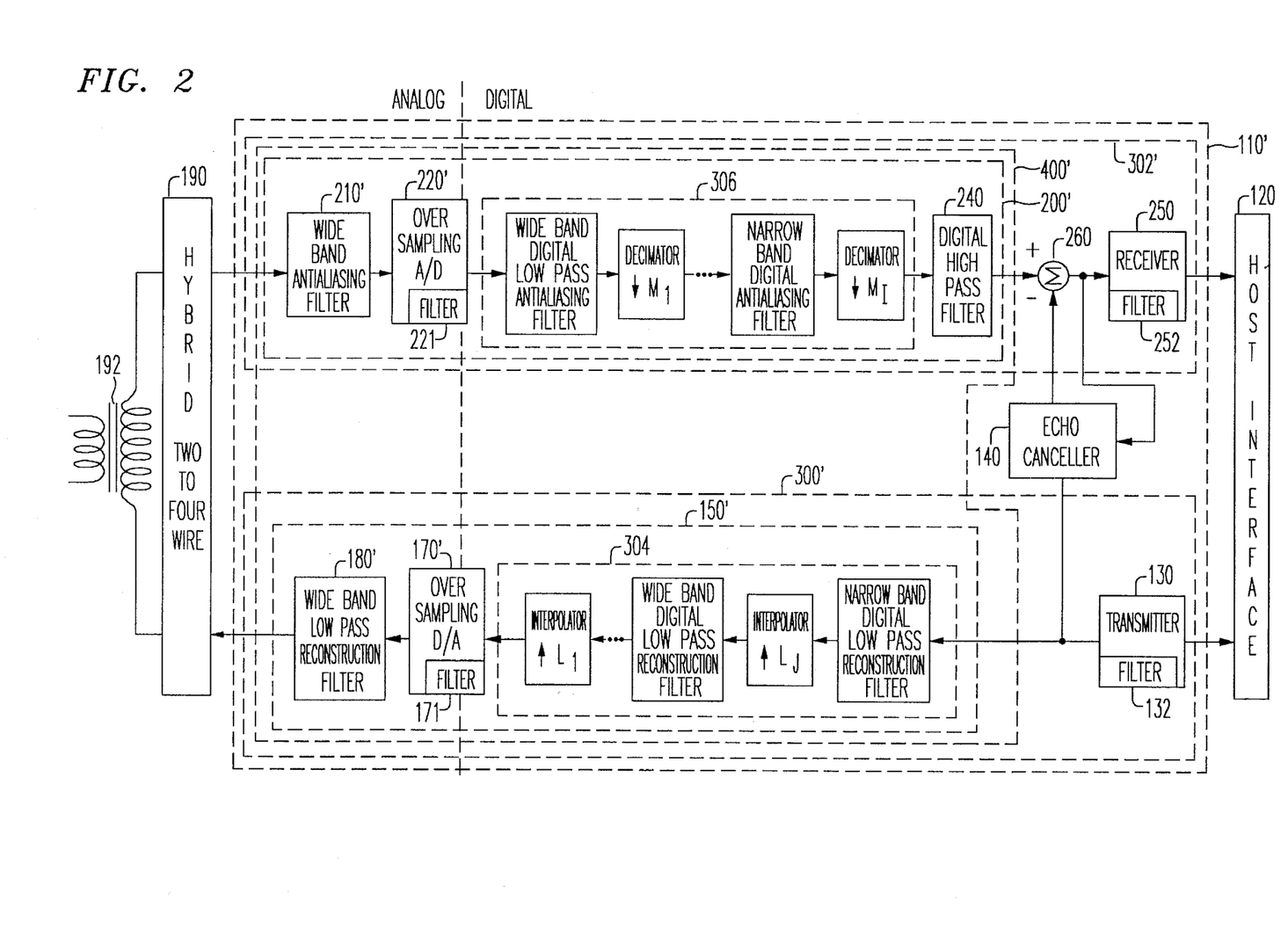
FIG. 2 is a block diagram showing an environment in which an alternate embodiment of the invention may be used.

FIG. 2 discloses a block diagram of an alternate embodiment modem 110' in which the converters may be oversampling converters. The number of stages of interpolation and decimation will differ from application to application. The reference numerals with a prime designation identify elements in the alternate embodiment where the function is similar to the element in the embodiment of FIG. 1 without a prime.

Analog-to-digital converter 220' and DAC 170' operate at a rate higher than the Nyquist rate, such as a multiple of the Nyquist rate. For example, analog-to-digital converter 220' may operate at M times the Nyquist rate and analog-to-digital converter 170' may operate at L times the Nyquist rate. Often M and L are equal, but the multiples are not constrained to be equal. The oversampling analog-to-digital converter 220' and DAC 170' can be, but are not limited to being noise shaping coders, sigma-delta modulators, or multibit converters of other architectures. When oversampling analog-to-digital converter 220' is a noise shaping coder, filter 221 is provided to shape the noise. Preferably, filter 221 is an optimum minimum phase FIR filter. When oversampling digital-to-analog converter 170' is a noise shaping coder, filter 171 is provided to shape the noise. Preferably, filter 171 is an optimum minimum phase FIR filter. Filters 121 and 171 are not required when the converters are not oversampling.

The process of lowering the sampling rate of a signal is called decimation. Decimation filter 306 removes the noise beyond the Nyquist frequency, which is known as antialias filtering. Following the filtering, decimation filter 306 lowers the sampling rate to the Nyquist rate. This can be achieved most efficiently in multiple stages as disclosed in *Multirate Digital Signal Processing* by Crochiere and Rabiner, Prentice-Hall, 1983, the disclosure of which is hereby incorporated by reference. The Crochiere and Rabiner guidelines as to the number of stages were followed.

The first stage of the decimation filter need not be a minimum phase FIR filter if the sampling rate in this stage is sufficiently high and the order of the filter is sufficiently low such that the delay through the filter is insignificant compared to the delay in the narrow band filters down stream in the signal path. For additional information on sigma-delta modulators followed by decimators, see J. C. Candy and G. C. Temes, eds., tutorial introduction from *Oversampling Delta-Sigma Data Converters*, IEEE Press, 1992. Another purpose of the decimation filter is to remove out of band quantization noise from the oversampling A/D converter 220' when A/D converter 220' is an oversampling sigma-delta modulator or other type of noise shaping coder.

Filter 210' serves a similar purpose as filter 210, to remove noise above the Nyquist rate. Since the sampling rate in A/D converter 220' is M times the Nyquist frequency, the filter order of filter 210' can be lower than the filter order of filter 210, and the stopband frequency of filter 210' can be higher such that the stopband frequency of filter 210' is M times the sampling frequency, less the Nyquist frequency.

Interpolation filter 304 increases the sampling rate above the Nyquist rate and removes spectral images that result from the interpolation process. This can be achieved most efficiently in multiple stages. The last stage of interpolation filtering need not necessarily be a minimum phase FIR filter, given that the sampling rate is sufficiently high and the order of the filter is sufficiently low such that the delay through the last filter stage is insignificant compared with the delay through the preceding stages of narrow band interpolation filters.

The wideband low pass reconstruction filter 180' removes spectral images that result from the oversampling digital-to-analog converter 170'. If the oversampling digital-to-analog converter is a sigma-delta modulator or other type of noise shaping coder, wideband low pass reconstruction filter 180' removes out of band quantization noise.

The filters shown in FIG. 2 are distributed, having multiple interpolators in the transmit path 300' and multiple decimators in the receive path 302'. When the number of stages of decimation is I in number, the total distributed decimation can be represented as $$M = \prod_{i=1}^{I} M_i$$

and the number of stages of interpolation is J in number, the total distributed decimation can be represented as $$L = \prod_{i=1}^{J} L_j.$$

Minimum phase FIR filters or optimum minimum phase FIR filters can be implemented on an integrated circuit, such as a general- purpose or special-purpose digital signal processor. Such an implementation would include multipliers for multiplying incoming discrete signals times tap weight coefficients of a filter to produce a plurality of products. The implementation would also include an adder or adders for summing the products, and a register in which to temporarily store the products.

We claim:

1. A coder-decoder for sending and receiving signals comprising:
   an analog-to-digital converter for converting an incoming analog signal into a plurality of first digital signal samples;
   a digital antialiasing filter for receiving the plurality of first digital signal samples;
   a decimator for reducing the number of said first digital signal samples provided from said digital antialiasing filter to provide a digital output signal having a predetermined signal rate less than the rate of said first digital signal samples;
   a digital low pass reconstruction filter for receiving a plurality of second digital signal samples and for filtering images of the base band from said second digital signal samples;
   an interpolator for increasing the number of said second digital signal samples provided from said digital low pass reconstruction filter to provide a digital output signal having a predetermined signal rate, greater than the rate of said second digital signal samples; and
   an oversampling digital-to-analog converter for converting the digital output signal received from the interpolator into an analog signal for sending, wherein at least one of said filters is a minimum phase finite impulse response filter.

2. A coder-decoder as recited in claim 1, wherein said coder-decoder is employed as a front-end circuit for a modem.

3. A coder-decoder as recited in claim 1, wherein the analog-to-digital converter is an oversampling analog-to-digital converter, sampling at a rate higher than the Nyquist rate.

4. A coder-decoder as recited in claim 1, wherein the oversampling digital-to-analog converter is an oversampling sigma-delta modulator.

5. A coder-decoder as recited in claim 1, wherein the oversampling digital-to-analog converter is a noise shaping coder.

6. A coder-decoder as recited in claim 5, wherein the noise shaping coder is an oversampling sigma-delta modulator.

7. A coder-decoder as recited in claim 5, wherein the noise shaping coder further comprises a noise shaping filter.

8. A coder-decoder as recited in claim 7, wherein the noise shaping filter comprises a minimum phase finite impulse response filter.

9. A coder-decoder as recited in claim 8, wherein the minimum phase finite impulse response filter is an optimum minimum phase finite impulse response filter.

10. A coder-decoder for sending and receiving signals comprising:
    an oversampling analog-to-digital converter for converting an incoming analog signal into a plurality of first digital signal samples;
    a digital antialiasing filter for receiving the plurality of first digital signal samples;
    a decimator for reducing the number of said first digital signal samples provided from said digital antialiasing filter to provide a digital output signal having a predetermined signal rate less than the rate of said first digital signal samples;
    a digital low pass reconstruction filter for receiving a plurality of second digital signal samples and for filtering images of the base band from said second digital signal samples;
    an interpolator for increasing the number of said second digital signal samples provided from said digital low pass reconstruction filter to provide a digital output signal having a predetermined signal rate greater than the rate of said second digital signal samples; and
    a digital-to-analog converter for converting the digital output signal received from the interpolator into an analog signal for sending, wherein at least one of said filters is a minimum phase finite impulse response filter.

11. A coder-decoder as recited in claim 10, wherein said coder-decoder is employed as a front-end circuit for a modem.

12. A coder-decoder as recited in claim 10, wherein the oversampling analog-to-digital converter is an oversampling sigma-delta modulator.

13. A coder-decoder as recited in claim 10, wherein the oversampling analog-to-digital converter is a noise shaping coder.

14. A coder-decoder as recited in claim 13, wherein the noise shaping coder is an oversampling sigma-delta modulator.

15. A coder-decoder as recited in claim 13, wherein the noise shaping coder further comprises a noise shaping filter.

16. A coder-decoder as recited in claim 15, wherein the noise shaping filter comprises a minimum phase finite impulse response filter.

17. A coder-decoder as recited in claim 16, wherein the minimum phase finite impulse response filter is an optimum minimum phase finite impulse response filter.

18. A coder-decoder for sending and receiving signals comprising:
    an oversampling analog-to-digital converter for converting an incoming analog signal into a plurality of first digital signal samples and for shifting quantization noise out of the baseband of said incoming signal;
    a digital antialiasing filter for receiving the plurality of first digital signal samples and for filtering said quantization noise from said first digital signal samples;
    a decimator for reducing the number of said first digital signal samples provided from said digital antialiasing filter to provide a digital output signal having a predetermined signal rate less than the rate of said first digital signal samples;
    a digital low pass reconstruction filter for receiving a plurality of second digital signal samples and for filtering images of the base band from said second digital signal samples;

an interpolator for increasing the number of said second digital signal samples provided from said digital low pass reconstruction filter to provide a digital output signal having a predetermined signal rate greater than the rate of said second digital signal samples;

an oversampling digital-to-analog converter for converting the digital output signal received from the interpolator into an analog signal for sending; and a digital high pass filter for receiving the plurality of first digital signal samples from the digital antialiasing filter and for filtering low frequency noise from the first digital signal samples, wherein at least one of said filters is a minimum phase finite impulse response filter.

19. A coder-decoder as recited in claim 18, wherein the minimum phase finite impulse response filter is an optimum minimum phase finite impulse response filter.

20. A modem for sending and receiving signals comprising:

an oversampling analog-to-digital converter for convening an incoming analog signal into a plurality of first digital signal samples and for shifting quantization noise out of the baseband of said incoming signal;

a digital antialiasing filter for receiving the plurality of first digital signal samples and for filtering said quantization noise from said first digital signal samples;

a decimator for reducing the number of said first digital signal samples provided from said digital antialiasing filter to provide a digital output signal having a predetermined signal rate less than the rate of said first digital signal samples;

a digital low pass reconstruction filter for receiving a plurality of second digital signal samples and for filtering images of the base band from said second digital signal samples;

an interpolator for increasing the number of said second digital signal samples provided from said digital low pass reconstruction filter to provide a digital output signal having a predetermined signal rate greater than the rate of said second digital signal samples;

an oversampling digital-to-analog converter for converting the digital output signal received from the interpolator into an analog signal for sending; and a transmitter for modulating received data into said plurality of second digital samples the transmitter, including a transmitter filter to filter the plurality of second digital samples, wherein at least one of said filters is a minimum phase finite impulse response filter.

21. A modem as recited in claim 20, wherein the minimum phase finite impulse response filter is an optimum minimum phase finite impulse response filter.

22. A modem as recited in claim 20, wherein the oversampling analog-to-digital converter is an oversampling sigma-delta modulator.

23. A modem as recited in claim 20, wherein the oversampling digital-to-analog converter is an oversampling sigma-delta converter.

24. A modem for sending and receiving signals comprising:

an oversampling analog-to-digital converter for converting an incoming analog signal into a plurality of first digital signal samples and for shifting quantization noise out of the baseband of said incoming signal;

a digital antialiasing filter for receiving the plurality of first digital signal samples and for filtering said quantization noise from said first digital signal samples;

a decimator for reducing the number of said first digital signal samples provided from said digital antialiasing filter to provide a digital output signal having a predetermined signal rate less than the rate of said first digital signal samples;

a digital low pass reconstruction filter for receiving a plurality of second digital signal samples and for filtering images of the base band from said second digital signal samples;

an interpolator for increasing the number of said second digital signal samples provided from said digital low pass reconstruction filter to provide a digital output signal having a predetermined signal rate greater than the rate of said second digital signal samples;

an oversampling digital-to-analog converter for converting the digital output signal received from the interpolator into an analog signal for sending; and a receiver for receiving the first digital signal samples filtered by the digital high-pass filter, the receiver including a receiver filter to filter the received first digital signal samples, wherein at least one of said filters is a minimum phase finite impulse response filter.

25. A modem as recited in claim 24, wherein the minimum phase finite impulse response filter is an optimum minimum phase finite impulse response filter.

26. A modem for sending and receiving signals comprising:

an oversampling analog-to-digital converter for converting an incoming analog signal into a plurality of first digital signal samples and for shifting quantization noise out of the baseband of said incoming signal;

a digital antialiasing filter for receiving the plurality of first digital signal samples and for filtering said quantization noise from said first digital signal samples;

a decimator for reducing the number of said first digital signal samples provided from said digital antialiasing filter to provide a digital output signal having a predetermined signal rate less than the rate of said first digital signal samples;

a digital low pass reconstruction filter for receiving a plurality of second digital signal samples and for filtering images of the base band from said second digital signal samples;

an interpolator for increasing the number of said second digital signal samples provided from said digital low pass reconstruction filter to provide a digital output signal having a predetermined signal rate greater than the rate of said second digital signal samples;

an oversampling digital-to-analog converter for converting the digital output signal received from the interpolator into an analog signal for sending; and a transmitter for modulating received data into said plurality of second digital samples the transmitter, including a transmitter filter to filter the plurality of second digital samples;

a receiver for receiving the first digital signal samples filtered by the digital high pass filter, the receiver including a receiver filter to filter the received first digital signal samples, wherein at least one of said filters is a minimum phase finite impulse response filter; and an echo canceler, the echo canceler for receiving the filtered plurality of second digital samples provided by the transmitter, and for receiving the first digital signal samples also received by the receiver, said echo canceler for canceling from the first digital signal samples the type of energy sent by the transmitter whereby echo is canceled from the plurality of first digital signal samples, the echo canceler providing as an output to a summing junction the plurality of first digital signal samples from which the echo was canceled, the summing junction adding said plurality of first digital signal samples to the plurality of first digital signal samples received from the digital high pass filter and providing the summed plurality of first digital signal samples to the receiver.

27. A modem as recited in claim 24, wherein the minimum phase finite impulse response filter is an optimum minimum phase finite impulse response filter.

28. A modem as recited in claim 26, wherein the echo canceler is adaptive.

29. A method of sending and receiving signals, comprising the steps of:

convening an incoming analog signal into a plurality of sequential first digital signal samples;

filtering the plurality of first digital signal samples;

reducing in number the plurality of said first digital signal samples to produce a plurality of second digital signal samples having a predetermined signal rate less than the rate of said plurality of first digital signal samples;

filtering the plurality of second digital signal samples to remove images of the base band from the plurality of second digital signal samples;

increasing the number of said plurality of second digital signal samples to provide a digital output signal having a predetermined signal rate greater than the rate of said second plurality of digital signal samples; and convening the digital output signal into an analog signal in an oversampling digital-to-analog converter, wherein at least one of the filtering steps provides minimum phase finite impulse response filtering.

30. A modem as recited in claim 20, further comprising:

a digital high pass filter for receiving the plurality of first digital signal samples from the digital antialiasing filter and for filtering low frequency noise from the first digital signal samples.

31. A modem as recited in claim 24, further comprising:

a digital high pass filter for receiving the plurality of first digital signal samples from the digital antialiasing filter and for filtering low frequency noise from the first digital signal samples.

32. A modem as recited in claim 26, further comprising:

a digital high pass filter for receiving the plurality of first digital signal samples from the digital antialiasing filter and for filtering low frequency noise from the first digital signal samples.

* * * * *